United States Patent
Ping et al.

(10) Patent No.: US 7,176,109 B2
(45) Date of Patent: Feb. 13, 2007

(54) METHOD FOR FORMING RAISED STRUCTURES BY CONTROLLED SELECTIVE EPITAXIAL GROWTH OF FACET USING SPACER

(75) Inventors: Er-Xuan Ping, Meridian, ID (US); Jeffrey A. McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 410 days.

(21) Appl. No.: 09/816,962

(22) Filed: Mar. 23, 2001

(65) Prior Publication Data

US 2002/0135029 A1   Sep. 26, 2002

(51) Int. Cl.
   *H01L 21/20* (2006.01)
(52) U.S. Cl. ............... 438/478; 257/E21.001
(58) Field of Classification Search ........ 438/300, 438/592, 595
   See application file for complete search history.

(56) References Cited

U.S. PATENT DOCUMENTS

| | | | |
|---|---|---|---|
| 4,442,178 A | 4/1984 | Kimura et al. ............... 428/446 |
| 4,554,570 A * | 11/1985 | Jastrzebski et al. ......... 257/331 |
| 4,757,027 A | 7/1988 | Vora ............................... 437/39 |
| 4,948,745 A | 8/1990 | Pfiester et al. ............... 438/290 |
| 4,963,506 A | 10/1990 | Liaw et al. .................. 438/482 |
| 5,057,888 A | 10/1991 | Fazan et al. ................ 357/23.6 |
| 5,079,180 A * | 1/1992 | Rodder et al. .............. 438/297 |
| 5,087,586 A | 2/1992 | Chan et al. ..................... 437/72 |
| 5,122,476 A | 6/1992 | Fazan et al. .................... 437/52 |
| 5,156,987 A | 10/1992 | Sandhu et al. ................. 437/40 |
| 5,198,378 A | 3/1993 | Rodder et al. ............... 438/297 |

(Continued)

FOREIGN PATENT DOCUMENTS

JP   401286361 A   11/1989

(Continued)

OTHER PUBLICATIONS

Blanton, T.N., et al., The Rigaku Journal, vol. 13, No. 1, 1996, pp. 3-7.

(Continued)

*Primary Examiner*—Scott B. Geyer
(74) *Attorney, Agent, or Firm*—Whyte Hirschboeck Dudek S.C.

(57) ABSTRACT

Raised structures comprising overlying silicon layers formed by controlled selective epitaxial growth, and methods for forming such raised-structure on a semiconductor substrate are provided. The structures are formed by selectively growing an initial epitaxial layer of monocrystalline silicon on the surface of a semiconductive substrate, and forming a thin film of insulative material over the epitaxial layer. A portion of the insulative layer is removed to expose the top surface of the epitaxial layer, with the insulative material remaining along the sidewalls as spacers to prevent lateral growth. A second epitaxial layer is selectively grown on the exposed surface of the initial epitaxially grown crystal layer, and a thin insulative film is deposited over the second epitaxial layer. Additional epitaxial layers are added as desired to provide a vertical structure of a desired height comprising multiple layers of single silicon crystals, each epitaxial layer have insulated sidewalls, with the uppermost epitaxial layer also with an insulated top surface. The resultant structure can function, for example, as a vertical gate of a DRAM cell, elevated source/drain structures, or other semiconductor device feature.

100 Claims, 8 Drawing Sheets

U.S. PATENT DOCUMENTS

| | | | |
|---|---|---|---|
| 5,200,352 A * | 4/1993 | Pfiester | 257/344 |
| 5,208,172 A | 5/1993 | Fitch | |
| 5,241,193 A | 8/1993 | Pfiester et al. | 257/67 |
| 5,304,834 A | 4/1994 | Lynch | 257/374 |
| 5,308,782 A * | 5/1994 | Mazure et al. | 438/154 |
| 5,312,768 A | 5/1994 | Gonzalez | 437/40 |
| 5,316,962 A | 5/1994 | Matsuo et al. | 437/52 |
| 5,360,760 A | 11/1994 | Hayashi | 117/93 |
| 5,376,562 A * | 12/1994 | Fitch et al. | 438/155 |
| 5,393,681 A * | 2/1995 | Witek et al. | 438/164 |
| 5,397,909 A | 3/1995 | Moslehi | 257/383 |
| 5,460,994 A | 10/1995 | Kim | 438/253 |
| 5,483,094 A | 1/1996 | Sharma et al. | 257/316 |
| 5,497,017 A | 3/1996 | Gonzales | 257/306 |
| 5,547,889 A | 8/1996 | Kim | 438/242 |
| 5,574,299 A | 11/1996 | Kim | 257/296 |
| 5,578,850 A | 11/1996 | Fitch et al. | 257/329 |
| 5,595,920 A | 1/1997 | Miyawaki et al. | 437/40 |
| 5,600,161 A | 2/1997 | Gonzalez et al. | 257/306 |
| 5,612,230 A | 3/1997 | Yuzurihara et al. | 437/21 |
| 5,612,563 A | 3/1997 | Fitch et al. | 257/329 |
| 5,627,395 A | 5/1997 | Witek et al. | 257/350 |
| 5,641,694 A | 6/1997 | Kenney | 438/156 |
| 5,677,573 A | 10/1997 | Prall et al. | 257/750 |
| 5,691,212 A | 11/1997 | Tsai et al. | 438/297 |
| 5,753,555 A * | 5/1998 | Hada | 117/9 |
| 5,753,947 A | 5/1998 | Gonzalez | 257/296 |
| 5,780,327 A | 7/1998 | Chu et al. | 438/156 |
| 5,780,906 A | 7/1998 | Wu et al. | 257/368 |
| 5,831,334 A | 11/1998 | Prall et al. | 257/750 |
| 5,841,150 A | 11/1998 | Gonzalez et al. | 257/3 |
| 5,843,826 A | 12/1998 | Hong | 438/300 |
| 5,849,077 A | 12/1998 | Kenney | 117/90 |
| 5,863,826 A | 1/1999 | Wu et al. | 438/423 |
| 5,864,180 A | 1/1999 | Hori et al. | 257/774 |
| 5,872,374 A | 2/1999 | Tang et al. | 257/328 |
| 5,886,382 A | 3/1999 | Witek | 257/329 |
| 5,888,294 A | 3/1999 | Min et al. | 117/84 |
| 5,902,125 A | 5/1999 | Wu | 438/300 |
| 5,933,738 A | 8/1999 | Kao et al. | 438/291 |
| 5,945,698 A | 8/1999 | Prall | 257/249 |
| 5,949,105 A | 9/1999 | Moslehi | 257/336 |
| 5,953,605 A | 9/1999 | Kodama | 438/231 |
| 5,963,822 A | 10/1999 | Saihara et al. | 438/481 |
| 5,970,351 A | 10/1999 | Takeuchi | 438/300 |
| 5,994,735 A | 11/1999 | Maeda et al. | 257/329 |
| 5,998,248 A * | 12/1999 | Ma et al. | 438/300 |
| 5,998,844 A | 12/1999 | Prall et al. | 257/377 |
| 6,001,697 A | 12/1999 | Chang et al. | 438/299 |
| 6,018,176 A | 1/2000 | Lim | 257/302 |
| 6,037,202 A | 3/2000 | Witek | 438/212 |
| 6,051,473 A | 4/2000 | Ishida et al. | 438/300 |
| 6,057,200 A | 5/2000 | Prall et al. | 438/300 |
| 6,072,226 A | 6/2000 | Thakur et al. | 257/506 |
| 6,074,478 A | 6/2000 | Oguro | 117/95 |
| 6,090,691 A | 7/2000 | Ang et al. | 438/564 |
| 6,096,596 A | 8/2000 | Gonzalez | 438/239 |
| 6,127,232 A | 10/2000 | Chatterjee et al. | 438/291 |
| 6,143,608 A | 11/2000 | He et al. | 438/264 |
| 6,159,852 A | 12/2000 | Nuttall et al. | 438/674 |
| 6,228,733 B1 | 5/2001 | Lee et al. | |
| 6,232,641 B1 | 5/2001 | Miyano et al. | 257/382 |
| 6,248,637 B1 | 6/2001 | Yu | 438/300 |
| 6,268,621 B1 | 7/2001 | Emmi et al. | 257/302 |
| 6,300,251 B1 | 10/2001 | Pradeep et al. | 438/710 |
| 6,319,782 B1 * | 11/2001 | Nakabayashi | 438/300 |
| 6,391,692 B1 * | 5/2002 | Nakamura | 438/151 |
| 6,392,271 B1 | 5/2002 | Alavi et al. | 257/328 |
| 6,433,382 B1 | 8/2002 | Orlowski et al. | 257/315 |
| 6,448,129 B1 | 9/2002 | Cho et al. | 438/241 |
| 6,455,377 B1 | 9/2002 | Zheng et al. | 438/268 |
| 6,458,699 B1 | 10/2002 | Nuttall et al. | 438/675 |
| 6,479,875 B1 | 11/2002 | Gonzalez | 257/396 |
| 6,492,232 B1 | 12/2002 | Tang | |
| 6,495,437 B1 | 12/2002 | Yu | 438/591 |
| 6,506,649 B2 | 1/2003 | Fung et al. | 438/300 |
| 6,509,239 B1 | 1/2003 | Nuttall et al. | 438/300 |
| 6,594,293 B1 | 7/2003 | Bulsara | 372/43 |
| 6,620,710 B1 | 9/2003 | Kamins | |
| 6,660,650 B1 | 12/2003 | Konecni | |
| 2001/0040292 A1 | 11/2001 | Hahn et al. | 257/750 |
| 2002/0072181 A1 | 6/2002 | Tseng | 438/300 |
| 2002/0093054 A1 | 7/2002 | Yeh et al. | 257/351 |
| 2004/0175893 A1 | 9/2004 | Vatus | 438/300 |

FOREIGN PATENT DOCUMENTS

JP    02001068671    3/2001

OTHER PUBLICATIONS

Van Zant, Peter, Microchip Fabrication, A Practical Guide to Semiconductor Processing, 4th Ed., McGraw-Hill, New York, NY (2000), Chapter 12 at pp. 380-388.

Wolf et al., Silicon Processing for the VLSI Era, vol. 1: Process Technology, 2nd Ed., Lattice Press, Sunset Beach, CA (2000), Chapter 7 (Silicon Epitaxial Grwoth and Silicon on Insulator) at pp. 225-264.

Ginsberg et al., "Selective epitaxial growth of silicon and some potential application," *IBM J. Res Develop.* 34(6): Nov. 1990.

Wolf, et al., Silicon Processing for the VLSI Era, vol. 1: Processing Technology, 1986, p. 155-156.

* cited by examiner

METHOD FOR FORMING RAISED STRUCTURES BY CONTROLLED SELECTIVE EPITAXIAL GROWTH OF FACET USING SPACER

FIELD OF THE INVENTION

The present invention relates to the field of semiconductor device fabrication, and more particularly to vertical transistors and other raised structures of a semiconductor device that are formed by controlled selective epitaxial growth.

BACKGROUND OF THE INVENTION

The storage capacity of a memory chip is dependent on the number of memory cells in the chip. High density dynamic random access memory (DRAMs) cells are comprised of two main components, a field-effect transistor (FET) and a storage capacitor. In DRAM fabrication, there is a continuing need to provide higher density memories in order to further increase data storage capacity.

Increasing circuit density in DRAM fabrication requires a reduction in the size of the FETs and storage capacitors of memory cells. As a solution to this problem, trench capacitors, vertically stacked capacitors, elevated source and drain structures, and other improved structures have been developed which require less surface area. However, photolithographic processing limits the minimal size of the feature and the resulting device that can be formed. Thus, the density of storage cells of a memory array has been limited by the resolution capability of the available photolithographic equipment.

Therefore, there is a need for a semiconductor fabrication technique to provide high density memory structures that can be fabricated without the limitations of photolithographic processing steps.

SUMMARY OF THE INVENTION

The present invention relates to elevated structures such as transistors and raised source/drain regions formed on a semiconductor substrate by controlled growth of epitaxial layers, and methods for forming such structures.

The invention utilizes selective epitaxial growth (SEG) to form vertically oriented structures on semiconductor substrates. Crystal growth by SEG along a select facet to form a vertically oriented structure cannot be controlled by varying the growth conditions due to the existence of facets on the crystal having different orientations i.e., (100), (110), (111). However, such control is needed to achieve vertically oriented epitaxial growth and eliminate lateral or horizontal growth that can short circuit closely positioned adjacent devices. The present method employs insulative spacers formed over the sidewalls of the epitaxial layers to eliminate unwanted lateral growth and control the growth of the epitaxial film.

In one aspect, the present invention provides a method for forming a vertical structure on a semiconductive substrate by selective epitaxial growth. An exemplary semiconductive substrate comprises monocrystalline silicon having a (100) orientation.

In one embodiment of the method of the invention, a vertical structure can be formed on a semiconductive substrate. The method involves selectively growing a first epitaxial layer of monocrystalline silicon on the surface of the substrate. Prior to the SEG step, it is desirable to remove oxide from the area on the substrate where the structure is to be formed, for example, by a dry oxide etch. The semiconductive substrate is exposed to a silicon-comprising gas in an epitaxial (epi) growth chamber for a time and under conditions effective to form an epitaxial layer of monocrystalline silicon having a faceted surface. The epitaxial layer comprises a single silicon crystal having vertically oriented sidewalls and a top horizontal surface, preferably defining a facet having a (100) plane orientation.

Upon forming the initial epitaxial layer on the surface of the substrate, a thin film of insulative material is formed over the epitaxial layer. Preferably, the insulation layer is formed by rapid thermal annealing, i.e., rapid thermal oxidation (RTO) to form an oxide film, or by rapid thermal nitridation (RTN) to form a nitride film. A portion of the insulative layer is then removed, preferably by reactive ion etching (RIE), to expose only the top (horizontal) surface of the epitaxial layer, with the insulative material remaining along the sidewalls as a spacer. A second epitaxial layer of monocrystalline silicon is grown by SEG on the exposed horizontal surface of the initial epitaxial layer. A thin insulative film is then formed over the second epitaxial layer. Further epitaxial layers can be similarly added to increase the height of the structure as desired, by repeating the foregoing steps.

The resultant vertically-oriented structure comprises multiple epitaxial layers having insulated sidewalls, with the uppermost layer having an insulated top surface. The structure can function, for example, as a vertical gate or word line of a DRAM cell, in which case it is preferred that the semiconductive substrate underlying the structure is lightly doped with a conductivity enhancing material. Source/drain regions can be formed adjacent to the structure by conventional methods, or as an elevated structure by the method of the invention, as described below.

In another embodiment of the method of the invention, a vertical structure of a desired height can be formed adjacent to an existing transistor gate or word line on a substrate. The gate or word line can be formed by the method of the invention, or by conventional methods known in the art. In forming vertical source/drain structures, the structures comprise a sufficient amount of a conductivity enhancing dopant to effectively provide the source and drain regions. The doping step can be performed during one or more SEG steps by flowing a silicon-comprising gas combined with a conductivity enhancing dopant onto the substrate, or after the structures have been formed by ion implantation.

According to another embodiment of the method of the invention, a plurality of elevated transistors can be formed on a substrate so as to define an array of transistors. The transistors can be isolated by areas of insulative material, such as shallow trench isolation regions comprising an oxide.

In yet another embodiment of the method, an elevated transistor can be formed on a semiconductive substrate, the transistor comprising a buried drain, a vertical gate, and an overlying source region. The buried drain can be formed in a semiconductive substrate by conventional ion implantation processing. An elevated gate can be formed by selectively growing an initial epitaxial layer of monocrystalline silicon on the substrate overlying the drain, depositing an insulative layer over the epitaxial layer, and selectively removing the horizontal surface of the insulative layer to expose only the top surface of the epitaxial layer. Additional epitaxial layers can be added by repeating the SEG step, and depositing the insulative layer, and selectively removing the insulative layer to maintain insulative material along the sidewalls as spacers to limit the growth of the epitaxial layer in a vertical orientation, resulting in a pillar-like gate structure having a desired height. A source region can then be formed by SEG above the uppermost epitaxial layer of the gate. To do so, a conductivity enhancing dopant can be added while the epitaxial layer is being deposited, or after the formed epitaxial layer is formed, for example, by ion implantation.

In another aspect, the invention provides raised structures comprising multiple layers of monocrystalline silicon formed by controlled selective epitaxial growth. An exemplary structure is a transistor comprising source/drain diffusion regions adjacent to a transistor gate, one or more of the foregoing components of the transistor comprising multiple epitaxial layers having insulated sidewalls and a top surface.

In one embodiment of a transistor, the transistor gate comprises at least two overlying layers of epitaxially grown silicon, each epitaxial layer comprising a single silicon crystal having a top or upper surface defining a facet, preferably having a (100) plane orientation, and vertically-oriented and insulated sidewalls. The uppermost epitaxial layer of the gate also has an insulated top surface, such that the gate is covered by a layer of insulative material. The gate is a vertical structure that is oriented in a vertical plane from the substrate surface. The source/drain comprises diffusion regions adjacent to the transistor gate within the semiconductive region, and can be formed according to known methods in the art.

In another embodiment of a transistor according to the invention, the source/drain regions are elevated structures that extend in a vertical plane from the substrate. The transistor gate comprises an existing vertical structure between the source/drain regions, which can be formed according to known methods in the art or in accordance with the invention. The source/drain structures comprise at least two overlying layers of epitaxially grown silicon, each epitaxial layer comprising a single silicon crystal having a top surface and vertically oriented insulated sidewalls. Preferably, the top surface of the epitaxial layers defines a facet having a (100) plane orientation. The top surface of the uppermost epitaxial layer is also insulated. The source/drain regions also comprise a conductivity enhancing dopant that is added as the epitaxial layers are deposited, or afterwards to the formed structure by ion implantation prior to depositing the insulative layer onto the uppermost epitaxial layer of the structure.

In yet another embodiment of a transistor according to the invention, both the transistor gate and the adjacent source/drain regions are vertical structures comprising multiple epitaxial layers having insulated sidewalls and an insulated top surface on the uppermost epitaxial layer.

A further embodiment of a transistor according to the invention comprises a drain buried within a semiconductive substrate, a vertical gate overlying the buried drain, and a source region overlying the gate. The vertical gate comprises at least two overlying layers of epitaxially grown silicon having sidewalls covered by an insulative material, with the uppermost epitaxial layer having a layer of insulative material over its top surface. The drain can comprise a doped area within the substrate underlying the gate. The source region comprises at least one layer of epitaxially grown silicon overlying the uppermost layer of the gate. The epitaxial layer of the source region has insulated sidewalls and on top surface, and is doped with a conductivity enhancing dopant.

The invention provides useful and improved vertically oriented structures such as transistor gates and elevated source/drain regions that extend outwardly from a substrate. Such structures are particularly suited for use in a DRAM cell or other semiconductor structure. The vertical nature of the structures allows a larger number of transistors or other semiconductor structures per surface area compared to conventional devices.

BRIEF DESCRIPTION OF THE DRAWINGS

Preferred embodiments of the invention are described below with reference to the following accompanying drawings, which are for illustrative purposes only. Throughout the following views, reference numerals will be used on the drawings, and the same reference numerals will be used throughout the several views and in the description to indicate same or like parts.

DETAILED DESCRIPTION OF THE PREFERRED EMBODIMENTS

The present invention encompasses methods of controlling growth of an epitaxial film in semiconductive wafer processing to form raised or vertical structures on a semiconductor surface, and structures formed from such methods, for example, transistors, capacitors, and elevated source/drain regions, among others.

In the current application, the term "semiconductive wafer fragment" or "wafer fragment" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but limited to, the semiconductive wafer fragments described above.

A first embodiment of a method of the present invention is described with reference to FIGS. 1A through 1I, in a method of forming raised source/drain structures by controlled selective epitaxial growth adjacent to an existing structure such as a gate or word line. To form elevated source/drain regions, the epitaxial layers are selectively grown from exposed monocrystalline source and drain substrate areas, and provided with sufficiently high conductivity doping to effectively provide source and drain regions.

Figure 1A:
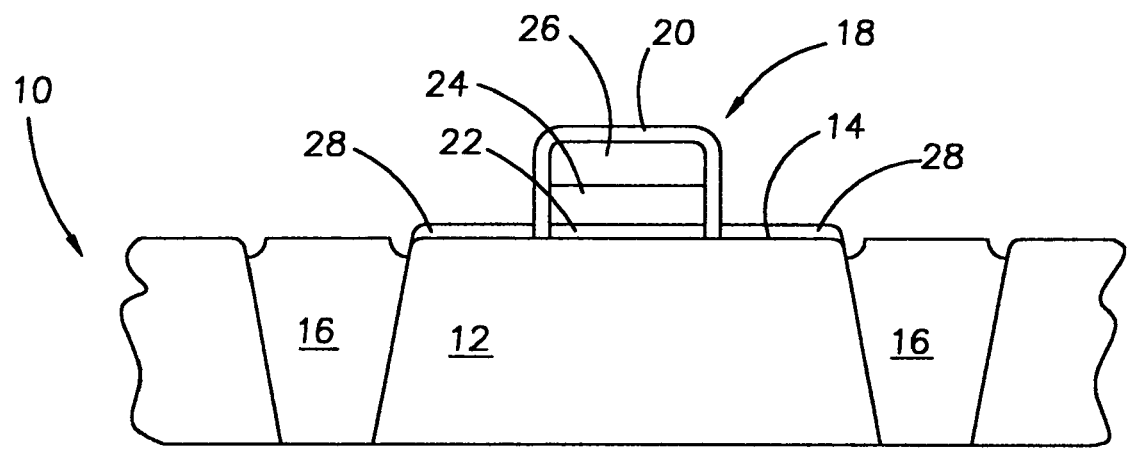
FIG. 1A is a diagrammatic cross-sectional view of a semiconductive wafer fragment at a preliminary step of a processing sequence.

Referring to FIG. 1A, a semiconductive wafer fragment 10 is shown at a preliminary processing step. Semiconductive wafer fragment 10 comprises a substrate 12 having a surface 14, and dielectric isolation regions 16 such as a shallow trench isolation (STI) region comprising an oxide. The substrate 12 typically comprises monocrystalline silicon having a (100) orientation, and typically includes a light conductivity dopant concentration.

Formed on the surface 14 of the substrate 12 is a structure 18 with an overlying insulative layer 20. An exemplary structure 18 is a word line or transistor gate. The word line or gate 18 can be formed by conventional methods known and used in the art. For example, a polysilicon layer 24 can be deposited by chemical vapor deposition (CVD) or other suitable method over a thin pad oxide layer 22 (about 200 to about 500 angstroms) grown on the substrate 12, and a silicide layer 26 can then be deposited by CVD or other method to form a polysilicon/silicide composite that is etched using a masking step, and covered with a thermally grown oxide insulative layer 20, resulting in the word line or gate structure 18. As shown, the word line or gate structure 18 is electrically isolated by means of the adjacent STI regions 16. The STI regions can also formed by conventional methods by etching a trench to a depth of about 1 micron or less into the substrate 12, and filling the trench with an insulative material such as silicon dioxide ($SiO_2$). An oxide layer 28 covers the substrate surface 14 adjacent the word line or gate structure 18.

Referring to FIGS. 1B through 1H, in one embodiment of the method of the invention, raised source/drain structures can be fabricated on a surface 14 of a semiconductive substrate adjacent to an existing word line or gate 18 by selective epitaxial growth (SEG). Using the present method, the source/drain regions 30, 32 can be fabricated to a height that is greater than conventional structures without lateral growth that poses problems with short circuiting adjacent structures. According to the method, thin epitaxial layers comprising a single silicon crystal with a facet having a plane orientation of (100), (110) or (111) on its upper or top surface, preferably a plane orientation of (100), are selectively grown on the surface of a monocrystalline silicon substrate and on subsequent crystal layers within an epitaxial (epi) growth reactor. Preferably, the epitaxial layers have a thickness of up to about 200 nm, preferably about 50 to about 200 nm, preferably about 70 to about 100 nm.

Preferably, the surface 14 of the substrate 12 is cleaned prior to the SEG step to remove oxides and other impurities. For example, the substrate 12 can undergo an oxide dry etch to remove an overlying oxide layer 28 and expose the surface 14 of the substrate. For example, the substrate can be etched by exposure to an $H_2$ gas at about 800° C. to about 850° C., or exposure to a reactive plasma such as $NF_3$ at about 100° C., in a chemical vapor deposition reactor. Another example of a cleaning method is to soak the substrate 12 with 0.5 vol. % diluted hydrofluoric acid (HF) to remove a native oxide film formed on the substrate surface, wash the substrate in deionized water for about two minutes, and dry the substrate using a spin drier. Other cleaning techniques can also be used to effectively clean the surface of the substrate.

Figure 1B:
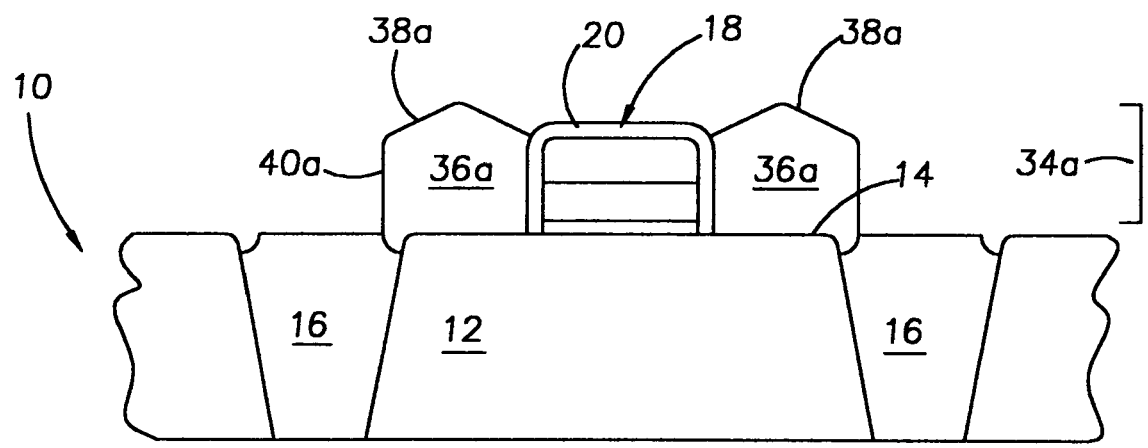
FIGS. 1B through 1H are views of the semiconductive wafer fragment of FIG. 1A at subsequent and sequential processing steps according to an embodiment of the method of the invention, showing fabrication of two elevated structures adjacent to a gate or word line.

In a first step shown in FIG. 1B, with at least a portion of the oxide layer 28 having been removed to expose surface 14 of the monocrystalline silicon substrate 12, a first layer 34a of monocrystalline silicon is formed on the exposed surface by selective epitaxial growth. The first layer 34a comprises a single crystal 36a that is preferably grown until a facet is formed on the top surface 38a. The facet surface can be a (100), (110) or (111) plane orientation, with a (100) plane orientation preferred. The plane orientation can be determined by known techniques in the art, for example, by cross-section and measuring the angles between the substrate and epi film, for example by scanning electron microscope (SEM) or transmission electron microscope (TEM).

The growth (SEG) step is performed using a silicon-comprising precursor gas, for example, $SiH_2Cl_2$ (dichlorosilane), $SiH_4$ (silane) with added chlorine, $Si_2H_6$ (disilane) with added chlorine ($Cl_2$), HCl or $H_2$, and $SiCl_4$ (silicon tetrachloride). During processing, the gases become thermally dissociated and adsorb onto the silicon substrate whereupon hydrogen atoms are released and silicon is deposited epitaxially. During the SEG step, an epitaxial layer is grown selectively on the monocrystalline silicon substrate, with no growth taking place on insulative layers (e.g., $SiO_2$ and $Si_3N_4$ layers), such as the STI regions 16 and the insulative layer 20 overlying portions of the epitaxial layer.

The epitaxial layer 34a can be grown using a conventional selective silicon epitaxial (epi) growth apparatus (not shown), which is a batch- or single-wafer, chemical vapor deposition (CVD) system. In general, an epi apparatus includes a growth chamber, a wafer heating source, an inlet for the precursor gases, a support for the silicon substrate (e.g., susceptor), and an exhaust system to remove effluent gases. Single-wafer epitaxial reactors are manufactured, for example, by Applied Materials, Inc.

In general, the semiconductive wafer is introduced into a growth chamber and transferred onto a heated susceptor. The wafer is heated to about 450° C. to about 950° C., preferably about 650° C. to about 750° C. The silicon-comprising precursor gas(es) are introduced into the growth chamber and flowed over the substrate at a low flow rate of about 10 to about 500 ccm, preferably less than about 100 sccm, for about 15 to about 30 seconds, while maintaining the chamber at a pressure of about 1 to about 20 Torr to provide a growth rate of about 20 to about 40 nm/minute, or at a pressure of about 0.02 to less than about 1 Torr to control facet growth at a lower rate of less than 20 nm/minute, preferably less than about 10 nm/minute to about 0.3 nm/minute. This provides control of layer thickness and formation of crystalline facets (100), (110) or (111) on the top surface of the epitaxial layers.

Figure 1C:
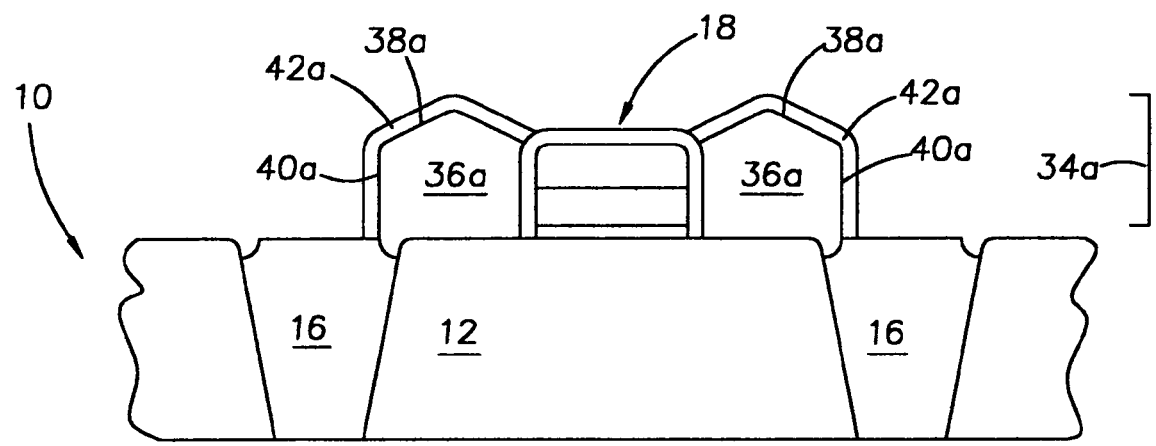

Once the facet is formed on the top surface 38a of the crystal 36a, a thin insulative layer 42a is formed over the epitaxial layer 34a. As illustrated in FIG. 1C, the insulative layer 42a is grown over the upper surface 38a and sidewalls 40a of the crystal 36a, preferably by rapid thermal anneal processing. The insulative layer 42a can comprise oxide, nitride, oxidized nitride, or a composite oxide/nitride layer. For example, using rapid thermal oxidation (RTO), a thin silicon dioxide ($SiO_2$) layer 42a can be formed by exposing the silicon surface to a dry oxygen ($O_2$) gas at a pressure of approximately 100 to about 200 Torr and temperature of about 800° C. to about 1200° C. for about 15 to about 60 seconds, to deposit a thin (about 5 nm to about 20 nm) oxide film. By another example, a thin silicon nitride ($Si_3N_4$) layer 42a can be formed using rapid thermal nitridation (RTN) by exposing the surface of the epitaxial layer 34a to ammonia ($NH_3$) or nitrogen ($N_2$) gas at a pressure of approximately 100 to about 200 Torr and temperature of about 800° C. to about 1200° C. for about 15 to about 60 seconds to deposit a thin (about 2 nm to about 5 nm) nitride film over the exposed upper surface 38a and sidewalls 40a of the crystal 36a.

Figure 1D:
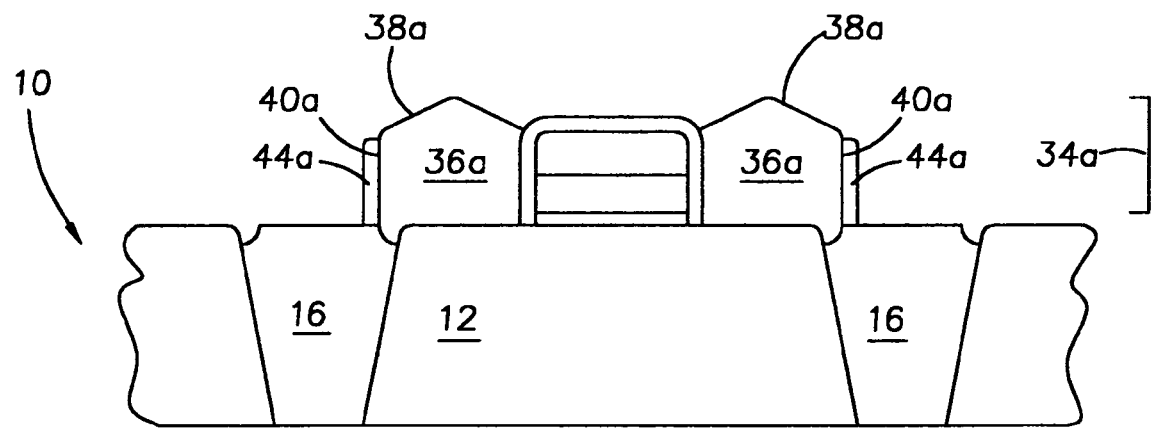

A portion of the thin insulative layer 42 is then removed to expose only the top surface 38a of the epitaxial layer 34a, as shown in FIG. 1D. The insulative material remaining on the vertical sidewall 40a of the crystal 36a forms a spacer 44a. An exemplary process for removing the insulative layer is by etching according to known procedures. Exemplary etch gases for etching the insulative layer 42a include fluorine-containing gases such as $CF_4$, $CHF_3$, $CH_2F_2$, $C_2F_6$, $C_3F_8$, $C_4F_8$, $CH_3F$, $CHF_3/O_2$, $CF_4/O_2$, among others. The insulative spacer 44a inhibits subsequent epitaxial growth of silicon in a lateral direction extending from the sidewalls 40a of the crystal 36a. This limits growth of the silicon crystals to along the top surface 38a of the crystal 36a for continued epitaxial growth in a vertical direction from the substrate 12.

Figure 1E:
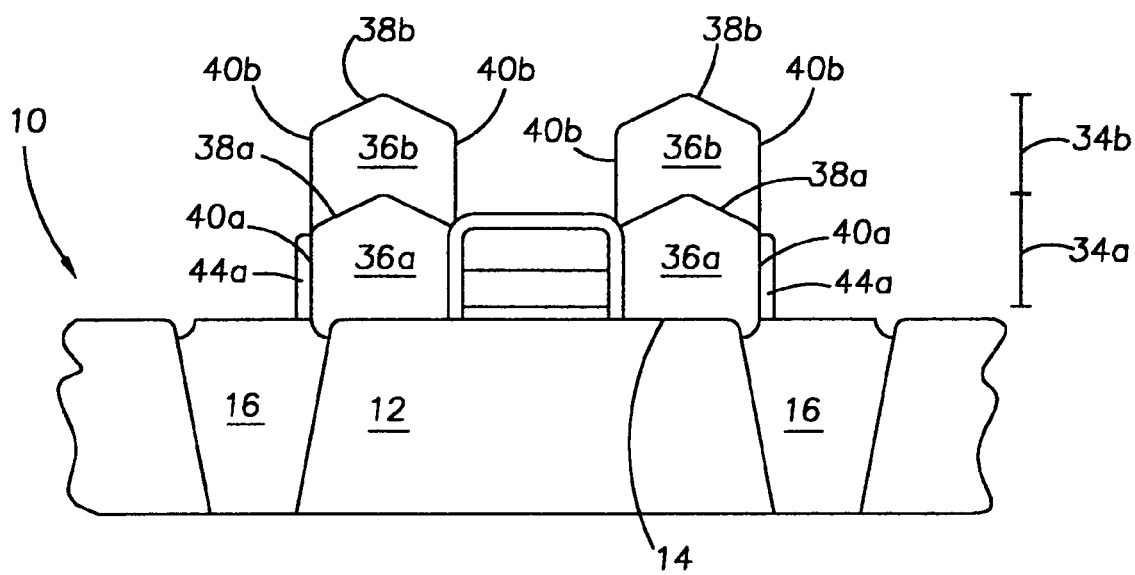

After the horizontal surface of the insulative layer 42a has been removed, further epitaxial growth on the exposed top surface 38a of the crystal 36a is commenced. Referring to FIG. 1E, a second epitaxial layer 34b of silicon is selectively grown on the exposed top surface 38a of the crystal 36a, by exposure to a silicon-comprising gas in an epi growth chamber, as previously described. The spacer 44a previously formed along the sidewall 40a of the crystal 36a serves to prevent epitaxial growth of silicon crystals in a lateral or horizontal direction from the sidewall 40a. The second epitaxial layer 34b comprises a single silicon crystal 36b that is selectively epitaxially grown preferably to provide a facet on its top surface 38b.

Figure 1F:
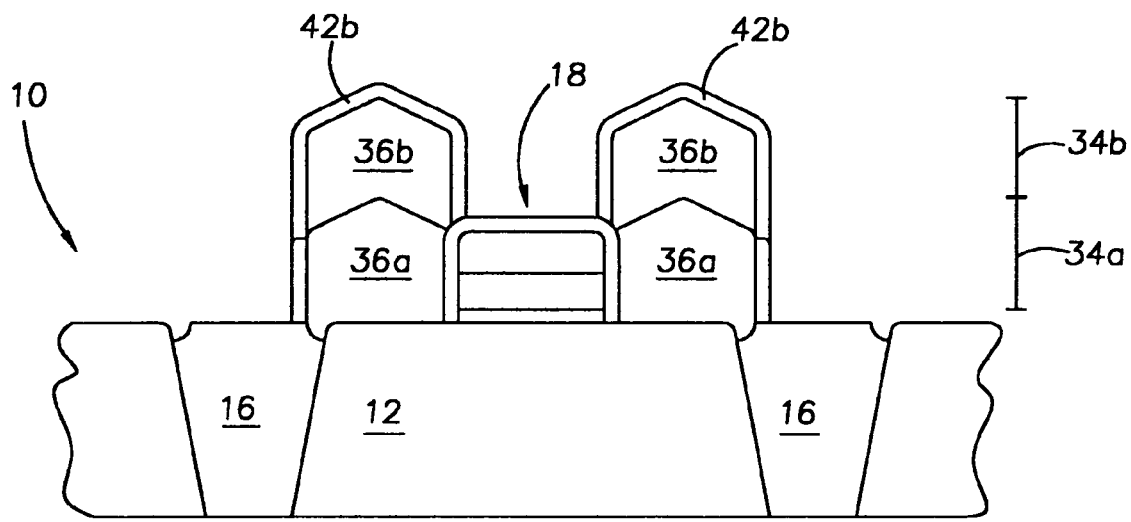

As depicted in FIG. 1F, a thin insulative layer 42b is then formed over the second epitaxial layer 34b, for example, by rapid thermal annealing, as previously described.

Figure 1G:
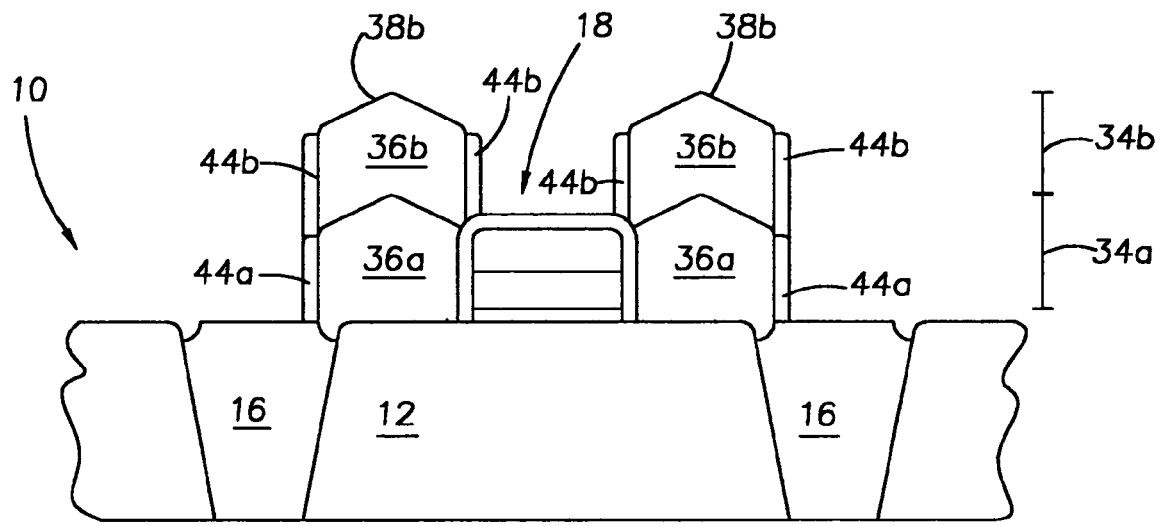
Figure 1H:
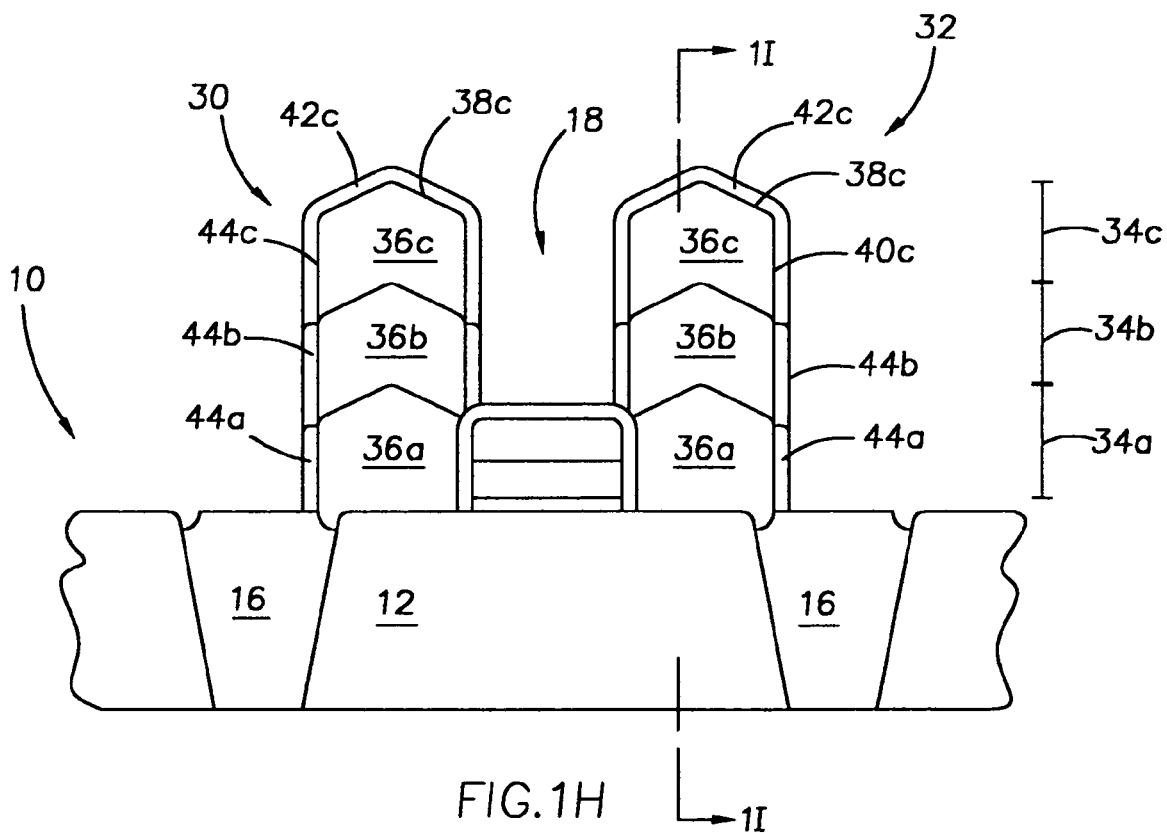
Figure 1I:
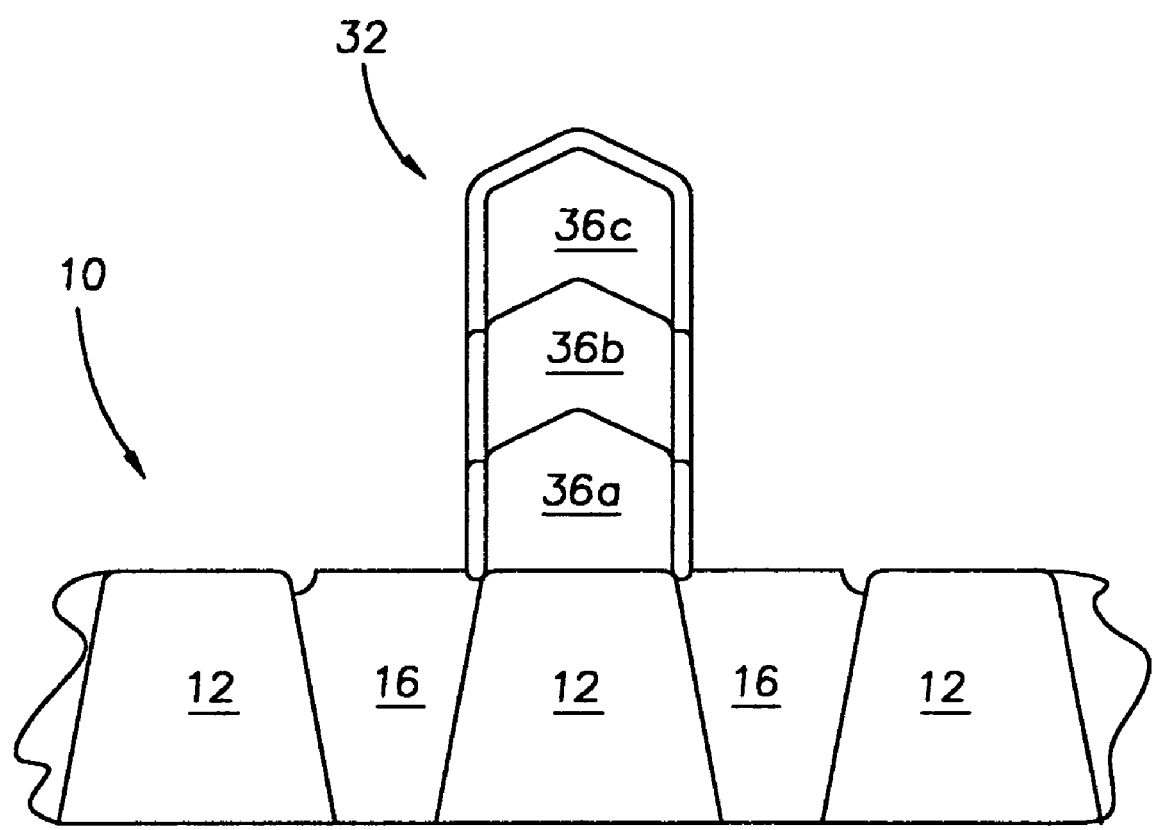
FIG. 1I is a cross-sectional view of the semiconductive wafer fragment of FIG. 1H taken along lines 1I—1I.

In a subsequent step, a portion of the thin insulative film 42b can then be etched to expose the top surface 38b of the crystal 36b, as shown in FIG. 1G.

A third epitaxial layer 34c can be grown on the exposed top surface 38b of the silicon crystal 36b comprising the second epitaxial layer 34b by a subsequent epitaxial growth step. The single crystal 36c is preferably grown until a facet is formed on the top surface 38c. The third epitaxial layer 34c can then be thermally annealed to form a thin insulative layer 42c over the crystal 36c, to result in the raised source/drain structures 30, 32, depicted in FIGS. 1H and 1I.

The epitaxial layers 34a, 34b forming the source and drain diffusion regions 30, 32 can be doped in situ to a p- or n-type conductivity by feeding a conductivity enhancing dopant to the reactor during one or more SEG process steps. Examples of dopants include p-dopants such as diborane ($B_2H_6$), boron trichloride ($BCl_3$) and boron trifluoride ($BF_3$), and n-dopants such as phosphine ($PH_3$) or arsine ($AsH_3$). The conductivity enhancing dopant can be fed to the reactor during deposition at a variable rate, for example, from a lower rate to a later higher rate over time, to provide a concentration gradient through the thickness of the epitaxial layer.

The formed source/drain structures 30, 32 can also be doped to a p- or n-type conductivity by a conventional doping technique known and used in the art, preferably by ion implantation, using a fluorine-based gas such as $PF_3$, $PF_5$, $AsF_5$, and $B^{11}F_3$, in an ionization chamber.

Figure 2A:
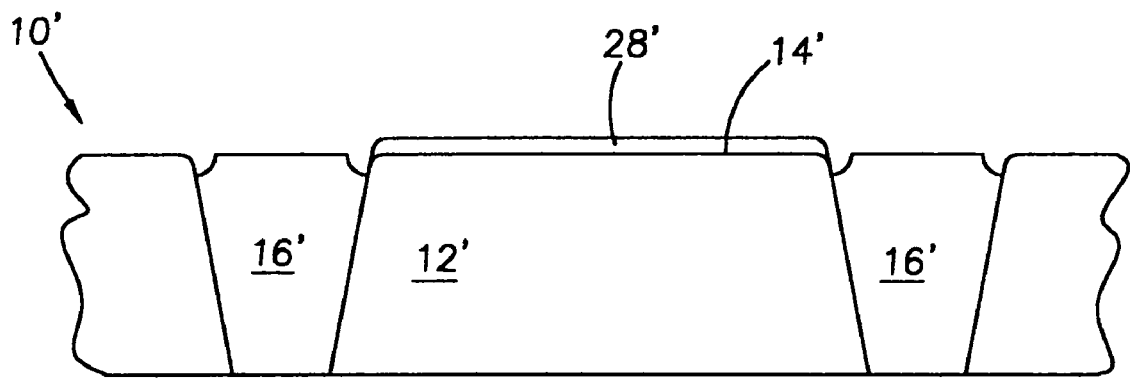
FIG. 2A is a diagrammatic cross-sectional view of a semiconductive wafer fragment at a preliminary step of a processing sequence.
Figure 2B:
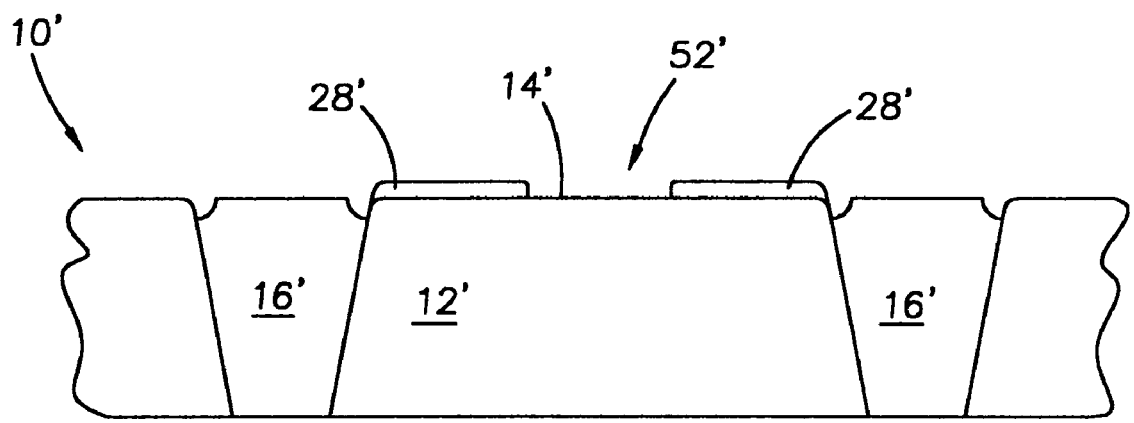
FIGS. 2B through 2F are views of the semiconductive wafer fragment of FIG. 2A at subsequent and sequential processing steps to fabricate a vertical transistor including a raised source/drain formed according to an embodiment of the method of the invention.
Figure 2C:
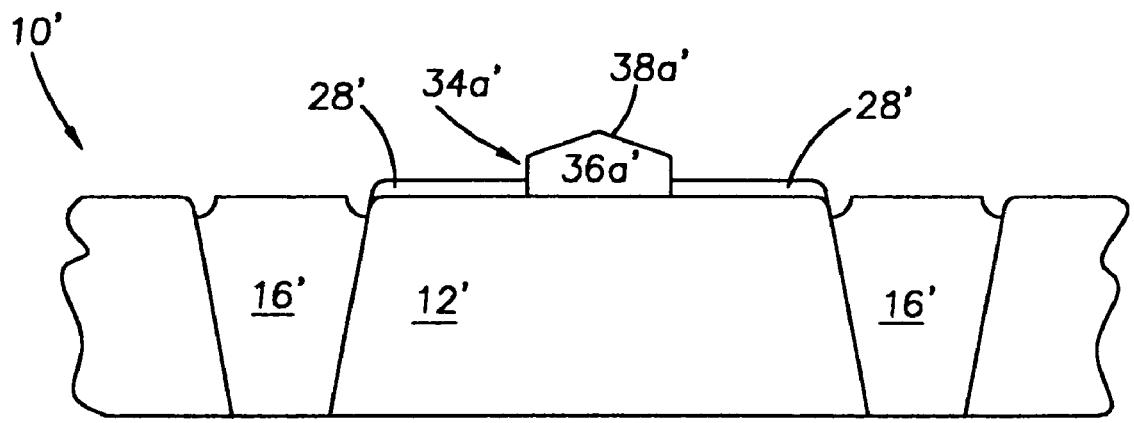
Figure 2D:
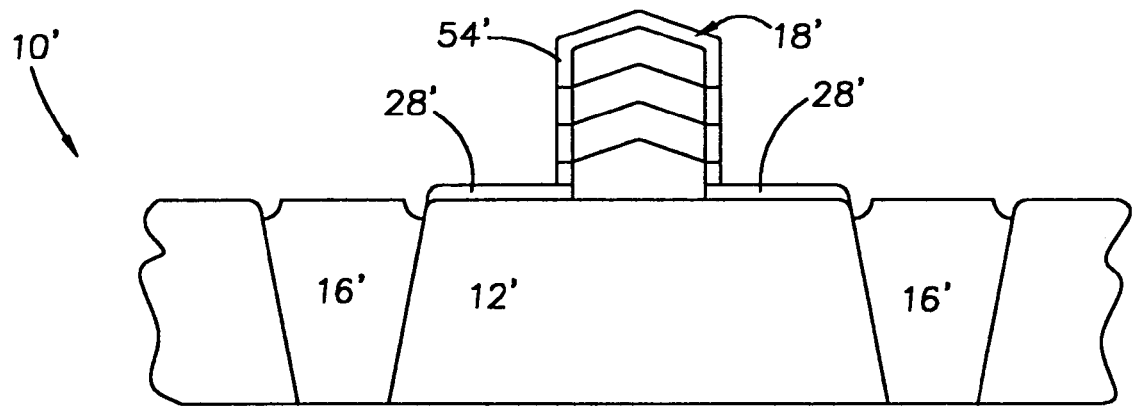
Figure 2E:
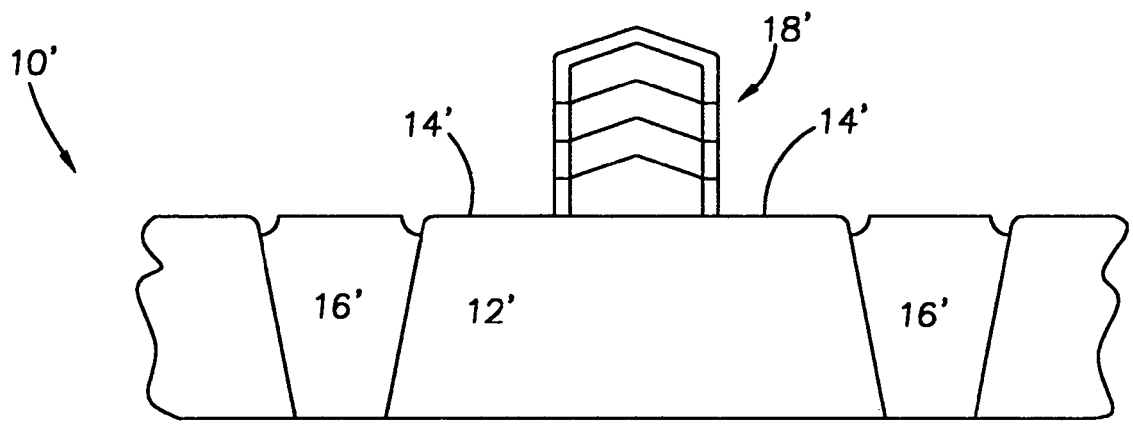
Figure 2F:
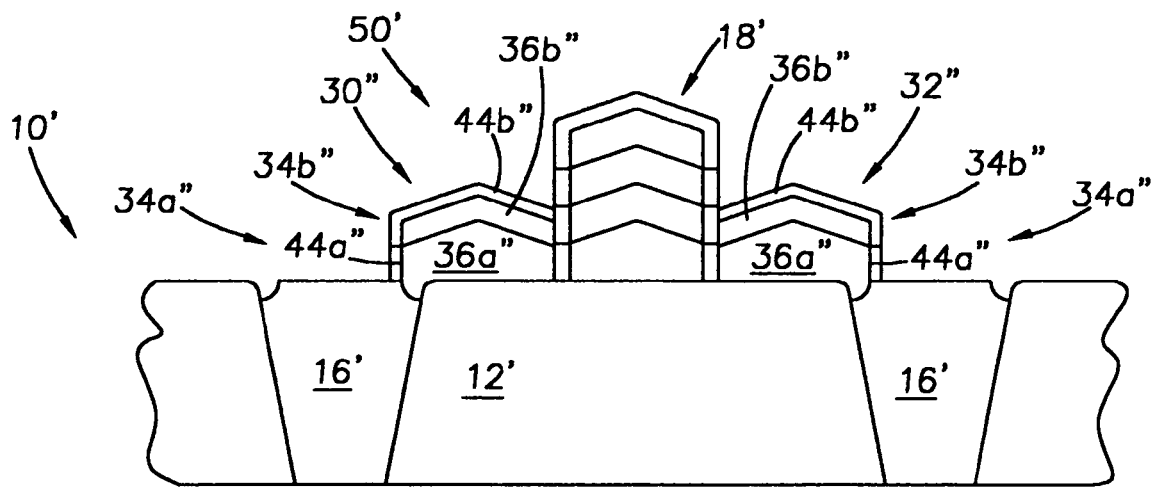

In another embodiment of the method of the invention, an elevated field effect transistor can be fabricated, as depicted in FIGS. 2A through 2F. As shown in FIG. 2F, the resultant transistor 50' is comprised of source/drain diffusion structures 30', 32' with a gate structure 18' thereinbetween to impart an electric field to enable current to flow between the source 30' and the drain 32' regions.

Referring to FIG. 2A, a wafer fragment 10' is shown before processing and includes a monocrystalline silicon substrate 12' surrounded by STI regions 16'. The monocrystalline silicon substrate 12' is used as the substrate for the formation of the gate 18' and the source/drain 30', 32' (shown in FIG. 2F). Typically, the substrate 12' includes a light conductivity dopant concentration. Substrate 12' can be provided with a selected p- or n-doping, depending upon whether an NMOS or a PMOS field effect transistor 50' is being formed in the substrate region. As shown, the surface 14' of the substrate 12' is covered by an oxide layer 28'.

Referring to FIG. 2B, an oxide dry etch step is first utilized to clear an opening portion 52' in the oxide layer 28' to expose the surface 14' of the silicon substrate 12' where the gate structure 56' is to be fabricated. Silicon epitaxial growth (SEG) is then performed as previously described with reference to FIGS. 1A through 1I, to form the gate structure 18'. In particular, as depicted in FIG. 2C, SEG is performed using the oxide layer 28' with opening 52' as a mask to form a first epitaxial layer 34a' on the exposed substrate surface 14'. The crystal 36a' of the first epitaxial layer has a facet on its upper surface 38a'. An insulative material is deposited over the epitaxial layer 34a', and then removed to expose the top surface of the epitaxial layer. The remaining insulative material provides spacers on the sidewalls of the epitaxial layer. One or more additional epitaxial layers can be grown as previously described with regard to FIGS. 1C through 1H, resulting in the gate structure 18' shown in FIG. 2D. The multi-layered gate structure 18' is encapsulated in an overlying insulating layer 54' comprised of the sidewall spacers and insulating layer formed onto the top surface of the uppermost epitaxial layer during the SEG processing steps.

Structures can then be formed adjacent to the gate structure 18' as depicted in FIGS. 2E and 2F, and provided with sufficiently high conductivity doping to effectively provide source and drain regions 30", 32" of the transistor 50'. As shown in FIG. 2E, the oxide layer 28' is removed, preferably by an oxide dry etch, to expose the surface 14' of the substrate 12'. The raised source 30" and raised drain 32" are then fabricated by growing an epitaxial layer 34a" of monocrystalline silicon on the surface 14' of the substrate 12', depositing an insulative layer and removing the layer to expose only the top surface of the epitaxial layer 34a" and leaving an insulative spacer 44a" on the sidewalls of the crystal 36a", and growing a second epitaxial layer 34b" comprising a single silicon crystal 36b" followed by an insulative layer 44b" over the epitaxial layer 34b". Additional epitaxial layers can be grown as desired according to the foregoing steps to achieve the desired height of the structure. In a raised source/drain application, a minimum height of about 10 nm to about 30 nm is desired.

The source and drain diffusion structures 30", 32" can be doped in situ to a p- or n-type conductivity by feeding a conductivity enhancing dopant to the reactor during the SEG steps, or after formation by ion implantation, as described above.

Figure 3A:
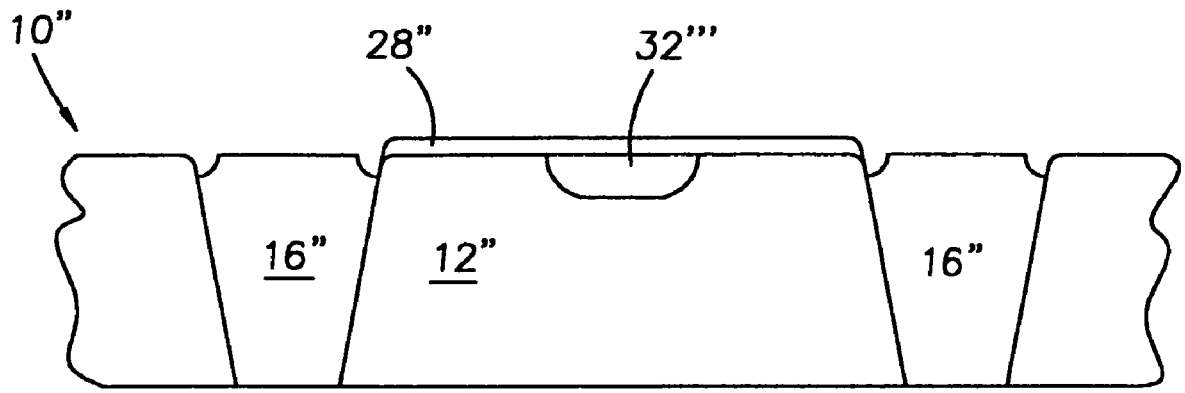
FIG. 3A is a diagrammatic cross-sectional view of a semiconductive wafer fragment at a preliminary step of a processing sequence.
Figure 3B:
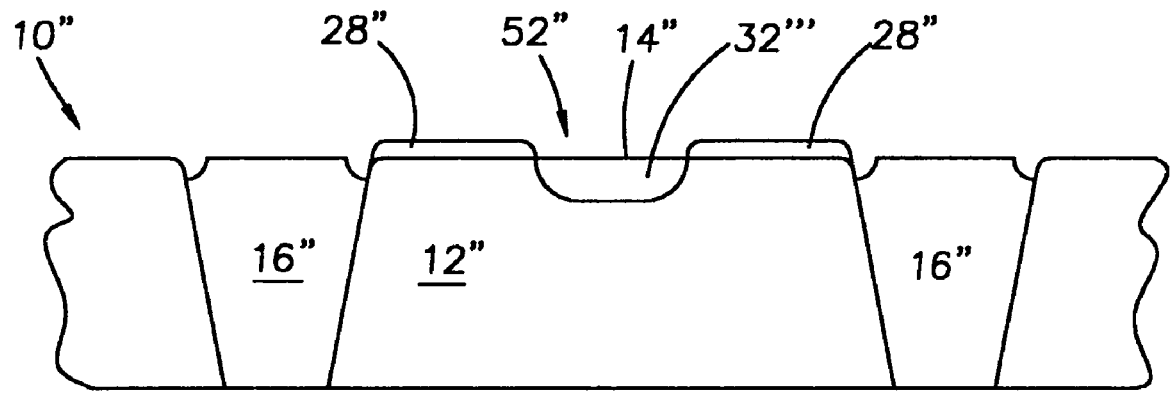
FIGS. 3B and 3C are views of the semiconductive wafer fragment of FIG. 3A at subsequent and sequential processing steps to fabricate a vertical transistor having a buried drain region and a stacked gate with an overlying source region according to an embodiment of the method of the invention.
Figure 3C:
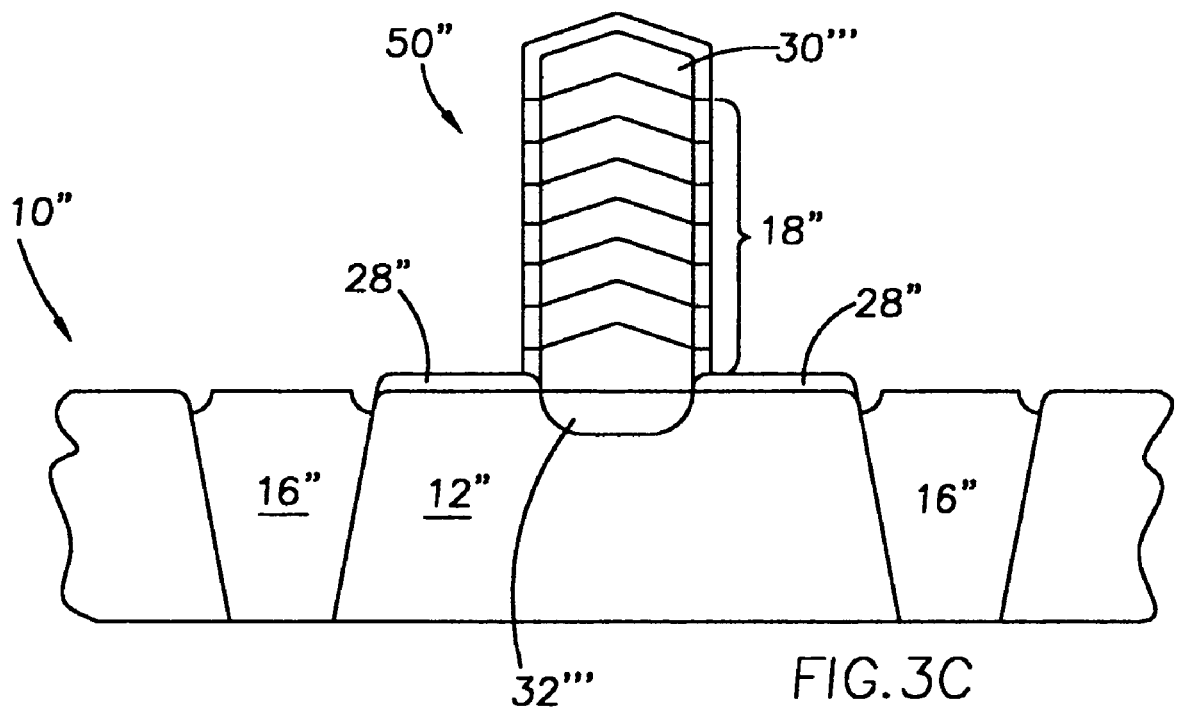

In another embodiment of the method of the invention a transistor 50" can be fabricated as depicted in FIGS. 3A through 3C. The transistor 50" includes a buried drain 32'", a vertical gate 18" comprising multiple epitaxial layers over the buried drain 32'", and a source region 30'" comprising one or more epitaxial layers above the gate 18". Advantageously, the vertical nature of a transistor 50" comprising a buried drain region 32", a gate region 18" built over the drain, and a source region 30''' overlying the gate, facilitates increased density memory structures in semiconductor fabrications.

Referring to FIG. 3A, the transistor 50'' is fabricated by first forming a buried drain 32''' in the substrate 12'' by heavily doping the drain region, about 50 nm to about 100 nm wide, by ion implantation. An oxide dry etch step can be utilized, as shown in FIG. 3B, to clear an opening 52'' in the oxide layer 28'' to expose the silicon substrate surface 14'' overlying the buried drain 32''', which defines the location of the gate structure 18''. As shown in FIG. 3C, a first epitaxial layer is grown on the exposed substrate surface 14'' by SEG using the oxide layer 28'' as a mask. Additional epitaxial layers are then successively grown on the preceding epitaxial layer, as described with reference to FIGS. 1A through 1H, to form the gate region 18'' having a desired height. Each of the epitaxial layers of the gate comprise insulated sidewalls and a top surface. The source region 30''' is formed above the gate structure 18'' by growing one or more layers of epitaxial silicon above the uppermost epitaxial layer of the gate structure 18''. The source layer 30''' can be doped with an effective concentration of a conductivity enhancing dopant by feeding the dopant to the reactor during the SEG step, or by ion implantation with a dopant after the source layer 30'' is formed. The source layer 30'' comprises insulated sidewalls and an insulated top surface.

In compliance with the statute, the invention has been described in language more or less specific as to structural and methodical features. It is to be understood, however, that the invention is not limited to the specific features shown and described, since the means herein disclosed comprise preferred forms of putting the invention into effect. Vertical structures other than those specifically described can be formed using the present method. The invention is, therefore, claimed in any of its forms or modifications within the proper scope of the appended claims appropriately interpreted in accordance with the doctrine of equivalents.

What is claimed is:

1. A method of forming a vertical structure on a substrate, comprising the steps of:
   selectively growing a first epitaxial layer of monocrystalline silicon on the substrate; the first epitaxial layer comprising sidewalls and a top surface;
   forming a layer of an insulative material over the sidewalls and the top surface of the first epitaxial layer;
   removing a portion of the insulative layer to form insulative spacers over the sidewalls and expose the top surface of the first epitaxial layer;
   selectively growing a second epitaxial layer of monocrystalline silicon on the exposed surface of the first epitaxial layer, the second epitaxial layer comprising sidewalls and a top surface; and
   forming a layer of an insulative material over the sidewalls and the top surface of the second epitaxial layer.

2. The method of claim 1, further comprising repeating the steps of removing a portion of the insulative layer, growing an epitaxial layer, and forming the insulative layer, until the vertical structure reaches a desired height; each of the epitaxial layers comprising insulative spacers over the sidewalls, and an uppermost epitaxial layer of the vertical structure having insulated sidewalls and an insulated top surface.

3. The method of claim 1, wherein the substrate comprises monocrystalline silicon.

4. The method of claim 1, wherein the substrate comprises monocrystalline silicon having a (100) plane orientation.

5. The method of claim 1, wherein at least one epitaxial layer is grown until a facet having a plane orientation of (100), (110), or (111) is formed on the top surface of the layer.

6. The method of claim 1, wherein the epitaxial layers are grown until a facet having plane orientation of (100) is formed on the top surface of the layers.

7. The method of claim 1, wherein each epitaxial layer has a thickness of up to about 200 nm.

8. The method of claim 1, wherein one or more epitaxial layers has a thickness of about 70 to about 100 nm.

9. The method of claim 1, wherein the steps of selectively growing the epitaxial layer comprise introducing a silicon-comprising gas over the substrate.

10. The method of claim 9, wherein the steps of selectively growing the epitaxial layer comprise:
    heating the substrate to about 450° C. to about 950° C.; and
    flowing at least one silicon-comprising precursor gas over the substrate at a rate of about 10 to about 500 ccm, for about 15 to about 30 seconds.

11. The method of claim 10, wherein the silicon-comprising gas is flowed over the substrate at a rate and pressure to provide a growth rate of the epitaxial layer at about 20 to about 40 nm/minute.

12. The method of claim 11, wherein the pressure is about 1 to about 20 Torr.

13. The method of claim 10, wherein the silicon-comprising gas is flowed over the substrate at a rate and pressure to provide a growth rate of the epitaxial layer at less than about 10 nm/minute.

14. The method of claim 13, wherein the pressure is about 0.02 to less than about 1 Torr.

15. The method of claim 13, wherein the pressure is about 0.02 to less than about 1 Torr to provide a growth rate of the epitaxial layer at about 0.3 to less than about 10 nm/minute.

16. The method of claim 9, wherein the silicon-comprising gas is selected from the group consisting of silane combined with chlorine, disilane combined with chlorine, disilane combined with hydrochloric acid, dichlorosilane, silicon tetrachloride, and combinations thereof.

17. The method of claim 9, wherein at least one of the steps of selectively growing the epitaxial layer comprises introducing the silicon-comprising gas with a conductivity enhancing dopant.

18. The method of claim 17, wherein the conductivity enhancing dopant is a p-type dopant.

19. The method of claim 18, wherein the conductivity enhancing dopant is a p-type dopant selected from the group consisting of diborane, boron trichloride, boron trifluoride, and combinations thereof.

20. The method of claim 17, wherein the conductivity enhancing dopant is an n-type dopant.

21. The method of claim 20, wherein the conductivity enhancing dopant is an n-type dopant selected from the group consisting of phosphine, arsine, and combinations thereof.

22. The method of claim 17, wherein the conductivity enhancing dopant is introduced at a variable rate to provide a concentration gradient of the dopant within the epitaxial layer.

23. The method of claim 22, wherein the conductivity enhancing dopant is introduced at an increasing rate to provide a low to high concentration of the dopant within the epitaxial layer.

24. The method of claim 2, further comprising doping the uppermost epitaxial layer by ion implantation.

25. The method of claim 24, wherein the epitaxial layer is doped using a fluorine-comprising gas selected from the group consisting of $PF_3$, $PF_5$, $AsF_5$, and $B^{11}F_3$.

26. The method of claim 17, wherein the vertical structure is a source or drain having a height of at least about 10 to about 30 nm.

27. The method of claim 1, further comprising, prior to the step of selectively growing the first epitaxial film, at least partially removing an oxide layer from the substrate.

28. The method of claim 27, wherein the step of removing the oxide layer is by an oxide dry etch.

29. The method of claim 28, wherein the oxide dry etch comprises exposing the substrate to an $H_2$ gas at about 800° C. to about 850° C.

30. The method of claim 28, wherein the oxide dry etch comprises exposing the substrate to a reactive plasma at about 100° C.

31. The method of claim 27, wherein the step of removing the oxide layer is by applying an oxide cleaning solution to the substrate.

32. The method of claim 1, wherein the insulative layer comprises oxide, nitride, oxidized nitride, or a composite oxide/nitride.

33. The method of claim 1, wherein the insulative layer comprises silicon nitride.

34. The method of claim 33, wherein the insulative layer has a thickness of about 5 to about 20 nm.

35. The method of claim 1, wherein the insulative layer comprises silicon oxide.

36. The method of claim 35, wherein the insulative layer has a thickness of about 2 to about 5 nm.

37. The method of claim 1, wherein at least one of the steps of forming the insulative layer is by annealing.

38. The method of claim 37, wherein the annealing is by rapid thermal nitridation to form a nitride insulative layer.

39. The method of claim 38, wherein the annealing by rapid thermal nitridation comprises exposing the epitaxial layer to ammonia or nitrogen gas at a pressure of about 100 to about 200 Torr and temperature of about 800° C. to about 1200° C.

40. The method of claim 37, wherein the annealing is by rapid thermal oxidation to form an oxide insulative layer.

41. The method of claim 40, wherein the step of annealing by rapid thermal oxidation comprises exposing the epitaxial layer to a dry oxygen gas at a pressure of about 100 to about 200 Torr and temperature of about 800° C. to about 1200° C.

42. The method of claim 1, wherein at least one of the steps of removing the insulative layer is by reactive ion etching.

43. The method of claim 42, wherein the reactive ion etching comprises exposing the insulative layer to an etch gas in an ionized state, the etch gas comprising at least one fluorine-containing gas.

44. The method of claim 1, wherein the vertical structure is formed adjacent to an existing gate or word line on the substrate.

45. The method of claim 44, wherein the existing gate or word line is electrically isolated.

46. A method of forming a raised structure on a substrate, comprising the step of:
   forming an epitaxial layer of monocrystalline silicon on the substrate;
   forming a layer of insulative material over the epitaxial layer;
   removing a portion of the insulative layer to form insulative spacers over sidewalls and expose a top surface of the epitaxial layer;
   forming another epitaxial layer of monocrystalline silicon on the epitaxial layer; and
   repeating the steps of forming the insulative layer, removing a portion of the insulative layer, and growing an epitaxial layer, until the vertical structure reaches a desired height, with the uppermost epitaxial layer having an insulated top surface.

47. A method of forming a vertical structure on a substrate, comprising the steps of:
   forming an epitaxial layer on the substrate, the epitaxial layer comprising sidewalls and a top surface;
   forming an insulative layer over the epitaxial layer;
   removing the insulative layer from the top surface of the epitaxial layer;
   forming another epitaxial layer on the epitaxial layer; and
   repeating the steps of forming the insulative layer, removing the insulative layer from the top surface of the epitaxial layer, and forming another epitaxial layer to form the vertical structure comprising multiple overlying epitaxial layers, each epitaxial layer comprising insulative spacers formed over the sidewalls, and the uppermost epitaxial layer having an insulated top surface.

48. A method of forming a vertical structure on a substrate, comprising the steps of:
   depositing a first epitaxial layer on the substrate, the first epitaxial layer comprising a horizontally oriented surface defining a facet and sidewalls;
   forming a layer of an insulative material over the first epitaxial layer;
   removing a portion of the insulative layer to expose the horizontal surface and form insulative spacers on the sidewalls of the epitaxial layer;
   depositing a second epitaxial layer on the exposed surface of the first epitaxial layer; the second epitaxial layer comprising a horizontally oriented surface defining a facet; and
   forming a layer of an insulative material over the second epitaxial layer.

49. The method of claim 48, further comprising repeating the steps of removing a portion of the insulative layer, growing an epitaxial layer, and forming the insulative layer, until the vertical structure reaches a desired height.

50. A method of controlling growth of an epitaxial film to form a vertical structure on a substrate, comprising the steps of:
   providing a substrate having an elevated structure disposed thereon, the elevated structure having an overlying insulative layer;
   forming a first epitaxial layer of monocrystalline silicon on the substrate adjacent to the elevated structure;
   forming an insulative layer over the first epitaxial layer;
   removing a horizontal surface of the insulative layer to form insulative spacers on sidewalls and expose a top surface of the first epitaxial layer;
   forming a second epitaxial layer of monocrystalline silicon over the first epitaxial layer; and
   repeating the foregoing steps until the vertical structure is at a desired height.

51. The method of claim 50, wherein the substrate has an overlying oxide layer, and the method further comprises prior to the step of depositing the first epitaxial layer, removing at least a portion of the oxide layer to expose the substrate.

52. The method of claim 50, wherein the elevated structure is disposed on an area of microcrystalline silicon that is isolated within the substrate by at least one dielectric isolation region formed in the substrate adjacent thereto.

53. The method of claim 52, wherein the at least one dielectric isolation region is a shallow trench isolation region comprising an oxide.

54. The method of claim 50, wherein the vertical structure is a transistor gate.

55. The method of claim 50, wherein the vertical structure is a source or drain, and at least one of the steps of forming the epitaxial layers is performed with a sufficiently high conductivity doping to effectively dope the source or drain.

56. The method of claim 55, wherein the elevated structure adjacent to the source or drain is a transistor gate.

57. The method of claim 55, wherein the vertical structure is a source or drain having a height of about 10 to about 30 nm.

58. A method of forming an elevated structure on a substrate in a semiconductor processing, comprising the steps of:
  providing a semiconductor substrate comprising monocrystalline silicon;
  growing a first epitaxial layer on the substrate until a horizontally-oriented facet is formed;
  forming an insulative layer over the first epitaxial layer;
  removing the insulative layer to form insulative spacers on sidewalls and expose a horizontal surface of the first epitaxial layer;
  growing a second epitaxial layer on the first epitaxial layer until a horizontally-oriented facet is formed; and
  repeating the steps of forming the insulative layer, removing a portion of the insulative layer, and growing an epitaxial layer, until the elevated structure is at a desired height.

59. The method of claim 58, wherein the horizontally-oriented facet of the first and second epitaxial layers has a (100) plane orientation.

60. A method of forming a raised structure on a silicon substrate, comprising the steps of:
  selectively growing a first epitaxial layer of monocrystalline silicon on the substrate;
  forming a layer of an insulative material over the first epitaxial layer;
  removing the insulative layer to form insulative spacers on sidewalls and expose an upper surface of the first epitaxial layer; and
  selectively growing one or more additional epitaxial layers of monocrystalline silicon to form the raised structure to a predetermined height, each epitaxial layer having sidewalls, insulative spacers formed on the sidewalls, and a top surface having the insulative layer removed therefrom, the uppermost epitaxial layer optionally comprising an insulated top surface.

61. A method of fabricating an epitaxial structure on a substrate, comprising the steps of:
  forming a first epitaxial layer of monocrystalline silicon on the substrate;
  annealing the epitaxial layer to form an insulative film thereover;
  etching the insulative film to form insulative spacers on sidewalls and expose a horizontal surface of the first epitaxial layer; and
  repeating the foregoing steps to form additional overlying epitaxial layers until a vertical structure having a desired height is reached, the vertical structure comprising multiple epitaxial layers comprising spacers formed on the sidewalls, with an uppermost epitaxial layer having insulated sidewalls and an insulated top surface.

62. The method of claim 61, wherein the step of forming the epitaxial layer comprises heating the substrate and flowing a silicon-comprising gas over the heated substrate.

63. The method of claim 62, wherein the substrate is heated to about 450° C. to about 950° C.

64. The method of claim 62, wherein the gas is flowed over the substrate to provide a growth rate of the epitaxial layer at about 20 to about 40 nm/minute.

65. The method of claim 64, wherein the gas is flowed over the substrate at a flow rate of about 10 to about 500 cm, and a pressure of about 1 to about 20 Torr.

66. The method of claim 62, wherein the gas is flowed over the substrate to provide a growth rate of the epitaxial layer of less than about 10 nm/minute to about 0.3 nm/minute.

67. The method of claim 66, wherein the gas is flowed over the substrate at a pressure of about 0.02 to less than 1 Torr.

68. The method of claim 61, wherein the step of annealing is by rapid thermal nitridation to form a nitride insulative layer.

69. The method of claim 61, wherein the step of annealing is by rapid thermal oxidation to form an oxide insulative layer.

70. The method of claim 61, wherein the step of etching the insulative layer is by reactive ion etching.

71. The method of claim 61, wherein each epitaxial layer has a thickness of about 50 to about 200 nm.

72. A method for forming a DRAM cell on a silicon substrate, comprising the steps of:
  forming a vertical gate structure on the substrate by the steps of:
    forming a first epitaxial layer of monocrystalline silicon on the substrate;
    forming a layer of an insulative material over the first epitaxial layer;
    removing a portion of the insulative layer to expose only a horizontal surface of the first epitaxial layer; and
    repeating the foregoing steps to form one or more additional overlying epitaxial layers until the gate structure is of a desired height, the gate structure comprising multiple overlying epitaxial layers having insulated sidewalls, and an uppermost epitaxial layer having an insulated sidewalls and a horizontal surface; and
  forming source and drain regions adjacent to the gate structure.

73. The method of claim 72, wherein the source and drain regions are elevated.

74. The method of claim 73, wherein the step of forming the source and drain regions comprises the steps of:
  forming while doping, a first epitaxial layer of monocrystalline silicon on the substrate adjacent to the gate structure;
  forming a layer of an insulative material over the first epitaxial layer;
  removing a portion of the insulative layer to expose only a horizontal surface of the first epitaxial layer;
  repeating the foregoing steps to form one or more additional overlying epitaxial layers until the source and drain regions are of a desired height, the source and drain regions comprising multiple overlying epitaxial layers having insulated sidewalls, and an uppermost epitaxial layer having insulated sidewalls and an insulated horizontal surface.

75. The method of claim 74, wherein the steps of forming the epitaxial layers comprise flowing a silicon-comprising gas and a conductivity enhancing dopant over the substrate.

76. The method of claim 75, wherein the conductivity enhancing dopant is flowed at an increasing rate over time to provide a low to high concentration of the dopant within the epitaxial layer.

77. The method of claim 72, wherein the step of forming the source and drain regions comprises the steps of:
forming a first epitaxial layer of monocrystalline silicon on the substrate adjacent to the gate structure;
forming a layer of an insulative material over the first epitaxial layer;
removing a portion of the insulative layer to expose only a horizontal surface of the first epitaxial layer;
repeating the foregoing steps to form multiple overlying epitaxial layers until the source and drain regions are of a desired height, the epitaxial layers having insulated sidewalls and an uppermost epitaxial layer having an exposed horizontal surface;
doping the uppermost epitaxial layer with a conductivity enhancing dopant by ion implantation; and
forming a layer of an insulative material over the uppermost epitaxial layer.

78. The method of claim 77, wherein the uppermost epitaxial layer is doped using a fluorine-comprising gas selected from the group consisting of $PF_3$, $PF_5$, $AsF_5$, and $B^{11}F_3$.

79. A method of forming an elevated source or drain structure on a substrate having a transistor gate disposed thereon, the method comprising the steps of:
selectively growing, while doping, a first epitaxial layer of monocrystalline silicon on the substrate adjacent to the transistor gate;
depositing a layer of an insulative material onto the first epitaxial layer;
removing a horizontal surface of the insulative layer such that insulative spacers are formed on sidewalls and a horizontal surface of the first epitaxial layer is exposed;
growing additional overlying epitaxial layers according to the foregoing steps until the elevated source or drain structure reaches a desired height; each epitaxial layer having insulated sidewalls;
wherein, upon growing an uppermost epitaxial layer and depositing the insulative layer thereon, no removal step is performed such that the uppermost epitaxial layer comprises insulative spacers disposed on the sidewalls and an insulated horizontal surface.

80. The method of claim 79, wherein during the steps of selectively growing the epitaxial layers, a conductivity enhancing dopant is deposited at an increasing rate over time to provide a low to high concentration of the dopant within the epitaxial layer.

81. A method of forming an elevated source or drain structure on a substrate having a transistor gate formed thereon,
selectively growing a first epitaxial layer of monocrystalline silicon on the substrate adjacent to the gate, the first epitaxial layer comprising a horizontal surface and sidewalls;
depositing a layer of an insulative material onto the horizontal surface and the sidewalls of the first epitaxial layer;
removing the insulative layer from the horizontal surface of the first epitaxial layer to form insulative spacers on the sidewalls;
growing additional overlying epitaxial layers according to the foregoing steps until the elevated source or drain structure reaches a desired height; each epitaxial layer having insulative spacers formed on the sidewalls and an exposed upper surface;
forming an uppermost epitaxial layer;
doping the uppermost epitaxial layer with a conductivity enhancing dopant by ion implantation; and
depositing a layer of an insulative material onto the uppermost epitaxial layer.

82. The method of claim 81, wherein the uppermost epitaxial layer is doped using a fluorine-comprising gas selected from the group consisting of $PF_3$, $PF_5$, $AsF_5$, and $B^{11}F_3$.

83. A method of forming an elevated transistor in a semiconductive wafer processing comprising the steps of:
providing a semiconductor substrate;
forming a buried drain in the substrate;
forming an elevated gate over the buried drain by the steps of:
forming a first epitaxial layer over the buried drain;
forming an insulative layer over the first epitaxial layer;
removing a portion of the insulative layer to form insulative spacers on sidewalls and expose a horizontal surface of the first epitaxial layer;
forming a second epitaxial layer over the first epitaxial layer;
forming an insulative layer over the second epitaxial layer; and
repeating the foregoing steps to form additional overlying epitaxial layers to form a pillar-like structure having a desired height; each epitaxial layer having insulative spacers formed on the sidewalls and an exposed horizontal surface; and
forming a source region onto the gate by forming at least one epitaxial layer over the uppermost epitaxial layer, while doping.

84. The method of claim 83, wherein the step of forming the buried drain comprises doping an area of the substrate with an n-type dopant.

85. The method of claim 84, wherein the substrate is doped by ion implantation.

86. The method of claim 84, wherein the n-type dopant is selected from the group consisting of phosphine, arsine, and combinations thereof.

87. The method of claim 84, wherein the doped area of the substrate is about 50 nm to about 100 nm wide.

88. The method of claim 83, wherein the step of forming the source region comprises doping the at least one epitaxial layer with an n-type dopant.

89. A method of semiconductive wafer processing, comprising forming an elevated transistor by the steps of:
providing a semiconductor substrate;
forming a buried drain in the substrate;
forming an elevated gate over the buried drain, the gate comprising multiple overlying epitaxial layers in a vertical orientation with each epitaxial layer comprising sidewalls and an upper surface, and insulative spacers formed on the sidewalls; and
forming a source region over the uppermost epitaxial layer of the gate, the source region comprising one or more epitaxial layers, each layer comprising sidewalls and an upper surface, and insulative spacers formed onto the sidewalls and the uppermost layer having an insulated top surface.

90. The method of claim 89, wherein the step of forming the elevated gate comprises:
depositing an epitaxial layer above the buried drain;
depositing a layer of insulative material over the epitaxial layer;
removing a horizontal surface of the insulative layer to expose the epitaxial layer and form insulative spacers on sidewalls of the epitaxial layer; and
repeating the foregoing steps until the gate reaches a desired height.

91. The method of claim 89, wherein the step of forming the source region comprises:
forming an epitaxial layer onto an exposed horizontal surface of an uppermost epitaxial layer of the gate, while doping with a conductivity enhancing dopant.

92. The method of claim 91, wherein the conductivity enhancing dopant is an n-type dopant selected from the group consisting of phosphine, arsine, and combinations thereof.

93. The method of claim 89, wherein the step of forming the source region comprises:
forming an epitaxial layer over an uppermost epitaxial layer, and doping the epitaxial layer of the gate with a conductivity enhancing dopant.

94. The method of claim 93, wherein the conductivity enhancing dopant is selected from the group consisting of $PF_3$, $PF_5$, $AsF_5$, and combinations thereof.

95. The method of claim 89, further comprising, prior to the step of forming the elevated gate, removing an oxide layer from the substrate overlying the buried drain.

96. The method of claim 89, wherein the step of forming the buried drain in the substrate comprises doping an area of the substrate with a conductivity enhancing dopant by ion implantation.

97. The method of claim 96, wherein the conductivity enhancing dopant is an n-type dopant selected from the group consisting of phosphine, arsine, and combinations thereof.

98. The method of claim 96, wherein the doped area of the substrate is about 50 nm to about 100 nm wide.

99. The method of claim 89, wherein a plurality of elevated transistors are formed on the substrate so as to define an array of transistors.

100. The method of claim 99, further comprising forming shallow trench isolation regions in the substrate to isolate the transistor.

* * * * *